US006486528B1

(12) United States Patent
Pedersen et al.

(10) Patent No.: US 6,486,528 B1
(45) Date of Patent: *Nov. 26, 2002

(54) SILICON SEGMENT PROGRAMMING APPARATUS AND THREE TERMINAL FUSE CONFIGURATION

(75) Inventors: David V. Pedersen, Scotts Valley; Michael G. Finley, Cambria; Kenneth M. Sautter, Sunnyvale, all of CA (US)

(73) Assignee: Vertical Circuits, Inc., Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/378,879

(22) Filed: Aug. 23, 1999

Related U.S. Application Data (63) Continuation of application No. 08/845,654, filed on Apr. 25, 1997, now Pat. No. 5,994,170, which is a continuation-in-part of application No. 08/265,081, filed on Jun. 23, 1994, now Pat. No. 5,675,180.

(51) Int. Cl.⁷ .............................. H01L 29/00; H05K 5/00

(52) U.S. Cl. ..................... 257/529; 361/733; 438/132

(58) Field of Search .................. 438/132, 128; 257/773, 678, 685, 686, 528, 529; 361/230, 233, 235, 733

(56) References Cited

U.S. PATENT DOCUMENTS

| | | | |
|---|---|---|---|
| 3,679,941 A | 7/1972 | Lacombe et al. |
| 3,691,628 A | 9/1972 | Kim et al. |
| 3,702,025 A | 11/1972 | Archer |
| 3,769,702 A | 11/1973 | Scarbrough |
| 3,813,773 A | 6/1974 | Parks |

(List continued on next page.)

FOREIGN PATENT DOCUMENTS

| | | |
|---|---|---|
| EP | 0010657 | 5/1980 |
| EP | 0175870 | 4/1986 |
| EP | 0178227 | 4/1986 |

(List continued on next page.)

OTHER PUBLICATIONS

Wojnarowski, R.J., et al. "Three Dimensional Hybrid Wafer Scale Integration Using the GE High Density Interconnect Process," *IEEE International Conference on Wafer Scale Integration*, Jan. 20, 1993.

Conte, Al S. "MCM–LThe Answer for Desktop Workstations," *ICEMM Proceedings*, (1993), pp. 18–21.

*Primary Examiner*—Michael Sherry
*Assistant Examiner*—Evan Pert
(74) *Attorney, Agent, or Firm*—Stephen E. Baldwin (57) ABSTRACT

The present invention is a method and apparatus for programming a stack of segments wherein each segment includes a plurality of die which are interconnected through metal interconnects patterned on the surface of each segment. Once the segments are arranged into a stack, the stack is connected to external circuits and each segment is addressed through control lines. Electrically conductive fuses on the segments are used as an interface between the control lines and the die. Segment level programming is performed on each segment by opening the conductive fuses on the segments in a predetermined pattern in order to route the control lines to each segment such that segments are uniquely addressed. After segment level programming, circuit board programming is performed so that any defective die found in the stack is logically replaced with replacement die in the stack. This is accomplished by connecting a set of metal switches between all the die and each of the control lines and by dispensing a conductive epoxy whisker between the control line for the defective die and the metal switch of the replacement die. When a subsequent attempt is made to address the defective die in the stack, the replacement die is accessed instead.

8 Claims, 10 Drawing Sheets

U.S. PATENT DOCUMENTS

| | | | |
|---|---|---|---|
| 3,930,304 A | * 1/1976 | Keller et al. ............ 257/50 |
| 3,999,105 A | 12/1976 | Archey |
| 4,300,153 A | 11/1981 | Hayakawa |
| 4,426,773 A | 1/1984 | Hargis |
| 4,525,921 A | 7/1985 | Carson et al. |
| 4,613,891 A | 9/1986 | Ng et al. |
| 4,612,083 A | 12/1986 | Yasumoto et al. |
| 4,646,128 A | 2/1987 | Carson et al. |
| 4,659,931 A | 4/1987 | Schmitz |
| 4,672,737 A | 6/1987 | Carson et al. |
| 4,677,528 A | 6/1987 | Miniet |
| 4,703,170 A | 10/1987 | Schmitz |
| 4,706,166 A | 11/1987 | Go |
| 4,761,681 A | 8/1988 | Reid |
| 4,764,846 A | 8/1988 | Go |
| 4,783,695 A | 11/1988 | Eichelberger |
| 4,801,992 A | 1/1989 | Golubic |
| 4,803,595 A | 2/1989 | Kraus |
| 4,807,021 A | 2/1989 | Okumura |
| 4,827,327 A | 5/1989 | Miyauchi et al. |
| 4,862,249 A | 8/1989 | Carlson |
| 4,894,706 A | 1/1990 | Sato et al. |
| 4,897,708 A | 1/1990 | Clements |
| 4,901,136 A | 2/1990 | Neugebauer et al. |
| 4,907,128 A | 3/1990 | Solomon |
| 4,939,568 A | 7/1990 | Kato |
| 4,941,033 A | 7/1990 | Kishida |
| 4,954,875 A | 9/1990 | Clements |
| 4,956,694 A | 9/1990 | Eide |
| 4,956,695 A | 9/1990 | Robinson |
| 4,956,746 A | 9/1990 | Gates et al. |
| 4,959,749 A | 9/1990 | Dzarnoski |
| 4,983,533 A | 1/1991 | Go |
| 4,989,063 A | 1/1991 | Kolesar, Jr. |
| 4,996,583 A | 2/1991 | Hatada |
| 5,006,923 A | 4/1991 | Warren |
| 5,013,687 A | 5/1991 | Solomon |
| 5,019,943 A | 5/1991 | Fassbender |
| 5,025,306 A | 6/1991 | Johnson et al. |
| 5,028,986 A | 7/1991 | Sugano et al. |
| 5,032,896 A | 7/1991 | Little et al. |
| 5,055,425 A | 10/1991 | Leibovitz |
| 5,075,253 A | 12/1991 | Sliwa, Jr. |
| 5,093,708 A | 3/1992 | Solomon |
| 5,104,820 A | 4/1992 | Go et al. |
| 5,111,278 A | 5/1992 | Eichelberger |
| 5,117,282 A | 5/1992 | Salatino |
| 5,128,831 A | 7/1992 | Fox, III et al. |
| 5,135,556 A | 8/1992 | Hornback |
| 5,138,437 A | 8/1992 | Kunamoto et al. |
| 5,138,438 A | 8/1992 | Masayuki |
| 5,172,303 A | 12/1992 | Bernardoni |
| 5,191,404 A | 3/1993 | Wu |
| 5,191,405 A | 3/1993 | Tomita |
| 5,198,888 A | 3/1993 | Sugano |
| 5,200,300 A | 4/1993 | Liebovitz |
| 5,202,754 A | 4/1993 | Bertin |
| 5,221,642 A | 6/1993 | Burns |
| 5,222,014 A | 6/1993 | Lin |
| 5,229,647 A | 7/1993 | Gnadinger |
| 5,231,304 A | 7/1993 | Solomon |
| 5,247,423 A | 9/1993 | Lin et al. |
| 5,259,110 A | 11/1993 | Bross et al. |
| 5,270,261 A | 12/1993 | Bertin |
| 5,270,571 A | 12/1993 | Parks et al. |
| 5,279,029 A | 1/1994 | Burns |
| 5,283,107 A | 2/1994 | Bayer et al. |
| 5,311,401 A | 5/1994 | Gates, Jr. et al. |
| 5,330,359 A | 7/1994 | Walker |
| 5,377,077 A | 12/1994 | Burns |
| 5,420,751 A | 5/1995 | Burns |
| 5,446,620 A | 8/1995 | Burns et al. |
| 5,455,740 A | 10/1995 | Burns |
| 5,475,920 A | 12/1995 | Burns et al. |
| 5,479,318 A | 12/1995 | Burns |
| 5,493,476 A | 2/1996 | Burns |
| 5,499,160 A | 3/1996 | Burns |
| 5,543,664 A | 8/1996 | Burns |
| 5,550,711 A | 8/1996 | Burns et al. |
| 5,552,963 A | 9/1996 | Burns |
| 5,561,591 A | 10/1996 | Burns |
| 5,566,051 A | 10/1996 | Burns |
| 5,659,182 A | * 8/1997 | Cohen |
| 5,698,895 A | * 12/1997 | Pederson et al. ............ 257/50 |
| 5,936,302 A | * 8/1999 | Pederson et al. ............ 257/665 |

FOREIGN PATENT DOCUMENTS

| | | |
|---|---|---|
| EP | 0 490 739 A1 | 12/1991 |
| EP | 0558855 | 9/1993 |
| FR | 2 638 894 | 11/1988 |
| WO | W8304141 | 11/1983 |
| WO | WO 93/00703 | 1/1992 |
| WO | W9203035 | 2/1992 |
| WO | W9401887 | 1/1994 |

* cited by examiner

SILICON SEGMENT PROGRAMMING APPARATUS AND THREE TERMINAL FUSE CONFIGURATION

CROSS-REFERENCE TO RELATED PATENT APPLICATION

The present application is a continuation of application Ser. No. 08/845,654, filed Apr. 25, 1997 (now U.S. Pat. No. 5,994,170) which is a continuation-in-part of application Ser. No. 08/265,081, entitled "Vertical Interconnect Process for Silicon Segments," filed on Jun. 23, 1994, and assigned to the assignee of the present application (now U.S. Pat. No. 5,675,180).

BACKGROUND OF THE INVENTION

The present invention relates to a method and apparatus for addressing integrated circuit chips, and more particularly to a method and apparatus for addressing a stack of silicon segments.

For many years, electrical components such as transistors and integrated circuits have been made using wafers of semiconductor material, including silicon and germanium. Integrated circuits have been provided on the wafer. Individual integrated circuits that are provided on the wafer are referred to as die, and include contact points called bond pads for external electrical connections. Typically, the die on the wafer are separated from one another by cutting the wafer along boundaries defining the die. Once the die are cut from the wafer, they are referred to as chips, and are packaged for use. In recent years, the proliferation of more powerful electronic systems has led to an increased need for higher density integrated circuit packages.

One method for creating higher density packages attempts to create entire computer systems on a single wafer using wafer scale integration (WSI) techniques. WSI technology attempts to laterally wire together all the die on a wafer using wires to interconnect the die. However, in order to create the necessary interconnections between the die, many wires are required that are extremely thin and difficult to create.

A second method for creating higher density packages attempts to reduce the area required for placing the chips on a circuit board by physically stacking the chips vertically. One chip stacking technique mounts individual die on ceramic carriers, encapsulates both the die and the carrier, stacks the carriers, and then mounts the stack on a printed circuit board. In this technique, all the die in the stack are interconnected by connecting the leads of the die to the printed circuit board via metal pins. This method results in an unusually high pin count on the circuit board which reduces the reliability of the circuitry because the high pin count increases the possibility that one of the many pins may become disconnected from the board.

Another chip stacking method uses a more complex process to stack die. This method modifies individual chips by adding a pattern of metallization, called rerouting leads, to the surface of the wafer. The rerouting leads extend from bond pads on the chip to newly formed bond pads, and are arranged so that all the rerouting leads terminate on one side of the modified chip. Each modified chip is then cut from the wafer, as shown by the dotted lines, and assembled into a stack. After the leads of the chips are exposed, a layer of metallization is applied to the leads along the side of the stack in order to electrically connect each of the modified chips in the stack. The stack is then mounted and connected to a substrate which is in turn connected to conventional circuitry.

The method of rerouting leads offers improvement in circuit density over prior methods, but is complex and expensive. In addition, the rerouting leads extend over five adjacent die which are destroyed when the modified chip is cut out of the wafer. In this method, five die are sacrificed for every chip that is modified.

Another method for creating higher density circuits creates stacks from entire wafers, rather than individual chips, to form a wafer array. In some devices, the wafers in the stack are electrically interconnected using solid vertical columns of metallic conductive feed-throughs, such as copper. The use of solid feed-throughs to interconnect wafers may cause damage to the array due to differential thermal coefficients of expansion during thermal cycles. Furthermore, the process is costly and makes the wafers difficult to separate for repairs.

Other methods also exist to interconnect stacks of wafers, as disclosed in, for example, U.S. Pat. No. 4,897,708 issued Jun. 30, 1990, and U.S. Pat. No. 4,954,875 issued Sep. 4, 1990. These methods provide each wafer in the stack with coned-shaped through holes which expose bonding pads on the wafers. The bond pads of the wafers in the stack are then electrically connected by either filling the through holes with electrically conductive liquid, or inserting an electrically conductive compliant material into the through holes, to provide a continuous vertical electrical connection between the wafers. While avoiding the disadvantages of using solid vertical columns of metal to interconnect wafers, the use of electrically conductive liquids and conductive materials requires special tooling to fill the through holes. Furthermore, for some applications, it may not be desirable to use stacks of entire wafers due to size constraints of the electrical device.

In integrated circuit packages, individual chips are accessed through the use of address lines, data lines, and control lines; collectively called control lines. The address lines are divided into row and column address lines which are controlled by a row address select line and a column address select line, respectively. To electrically connect an integrated circuit package to a substrate, such as to a printed circuit board for example, the control lines are extended from individual chips in the integrated circuit packages to the circuit board via metal traces. Since the addressing of chips is, in effect, hard wired once the integrated circuit package is connected to a substrate, defective chips are typically discarded before the chips are stacked and/or connected to a circuit board in order to save space and to avoid the difficulty and expense associated with rerouting the control lines from defective chips to functioning chips.

In parent application Ser. No. 08/265,081 (now U.S. Pat. No. 5,675,180 issued Oct. 7, 1997), which is herein incorporated by reference, a vertical interconnect process (VIP) is disclosed which provides an improved method and apparatus for creating higher density packages. In VIP, a segment is formed by grouping a plurality of adjacent die on a wafer. The plurality of die on a segment are interconnected on the segment using one or more layers of metal interconnects. The metal interconnects function not only to interconnect the die, but also to provide segment bond pads, which serve as external electrical connection points. After the die are interconnected, each segment is cut from the wafer so as to have beveled edge walls. Segments are then placed on top of one another to form a stack of segments, as opposed to a stack of individual chips, and the segments are electrically connected through the application of electrically conductive epoxy along the beveled edges of the stack. The stack of electrically interconnected segments is then mounted to a circuit board.

Since a portion of the die on a wafer may not function and the defective die are not cut from the wafer and discarded, addressing the stack and the die therein solely through the use of hard-wired control lines, as in prior art methods, is inadequate because a computer or the like may attempt to access a defective die in the stack.

SUMMARY OF THE INVENTION

Accordingly, it is an object of the present invention to provide an improved method and apparatus for uniquely addressing chips, as well as stacks of segments.

The present invention is a method and apparatus for programming a stack of segments that provides an addressing scheme capable of uniquely addressing each segment in a stack as well as providing access to a functioning die when an attempt is made to access a defective die in the stack. Each segment in the stack includes a plurality of die which are interconnected through metal interconnects patterned on the surface of each segment. Once segments are arranged into a stack, external circuits access the segments through control lines. Connected between all of the die on each segment and the control lines are electrically conductive fuses. The segments, which are all located on different levels of the stack, are programmed by opening the conductive fuses in a predetermined pattern on each die so that the control line associated with that level of the stack is routed to all the die on that segment, thereby making each segment address in the stack unique.

After the stack is connected to the external circuits in a particular electronic application, the stack is programmed so that a defective die in the stack is logically replaced with a replacement die in the stack. This is accomplished by connecting a set of metal switches between all the die and each of the control lines. The control line for the defective die is then routed to the replacement die by dispensing conductive epoxy between the replacement die's metal switch and the control line for the defective die. When an attempt is made to address the defective die's location in the stack, the replacement die is accessed instead.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the following detailed description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
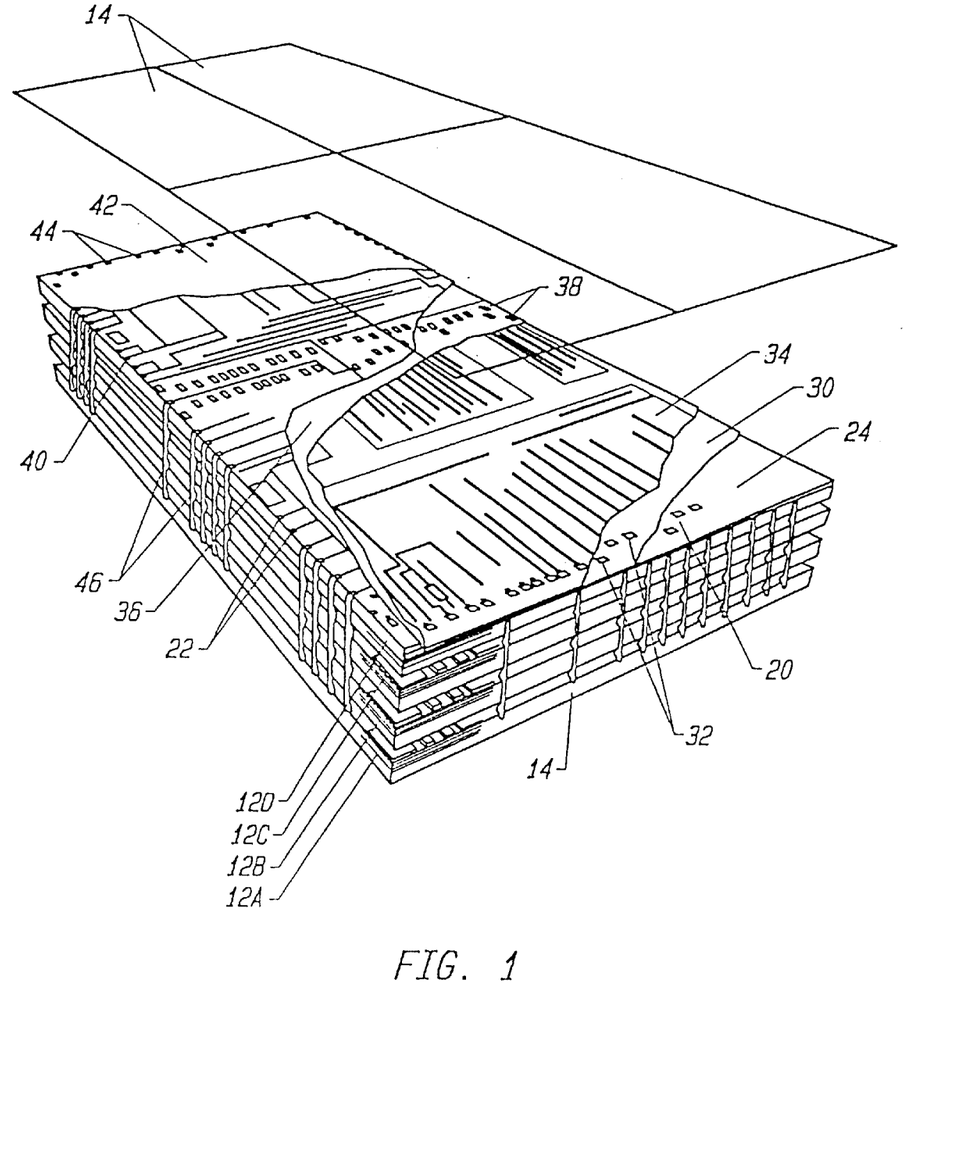
FIG. 1 is a cut-away perspective view illustrating a stack of segments.

Referring to FIG. 1, a cut-away perspective view is shown of a stack 10 (FIG. 8) of the present invention. The stack 10 includes four segments, 12a, 12b, 12c, and 12d (hereinafter segments 12) where each of the segments 12 represent a different level in the stack 10. As disclosed in U.S. Pat. No. 5,675,180, the segments 12 each include four die 14 arranged in a two-by-two matrix, as shown by the positional overlay of the four die 14 on each level of the stack.

Each of the die 14 on the segments 12 are interconnected using multiple layers of die interconnect circuitry. As shown in FIG. 1, the die interconnect circuity on each segment 12 includes two layers of gold interconnects 34 and 40 which function to communicate power and electrical signals between die bond pads 20 as well as to selected segment bond pads 22. The die 14 first are insulated with a polyimide layer 30 that covers the entire surface 24 of the segments 12 except for a first set of holes 32 in the polyimide layer 30 which expose the surface of the die bond pads 20. The first layer of gold interconnects 34 is supported by the polyimide layer 30 and makes electrical connection to the die bond pads 20 through the first set of holes 32.

The first layer of gold interconnects 34 is insulated with a second polyimide layer 36, and a second set of holes 38 in the second polyimide layer 36 exposes selected portions of the first layer of gold interconnects 34. The second layer of gold interconnects 40 is supported by the second polyimide layer 36 and makes electrical connection with the first layer of gold interconnects 34 through the second set of holes 38. Finally, a third polyimide layer 42 insulates the second layer of gold interconnects 40, and cutouts 44 around the four edges of the segments 12 expose selected portions of the second layer of gold interconnects 40, forming the segment bond pads 22. To electrically connect the segments 12 in the stack 10, electrically conductive epoxy traces 46 are dispensed along the edges of the stack 10 in contact with the segment bond pads 22 on each of the segments 12. The electrically conductive epoxy traces 46 also function to allow external electrical circuits to address the segments 12 after the segments are programmed, as explained below.

Figure 2:
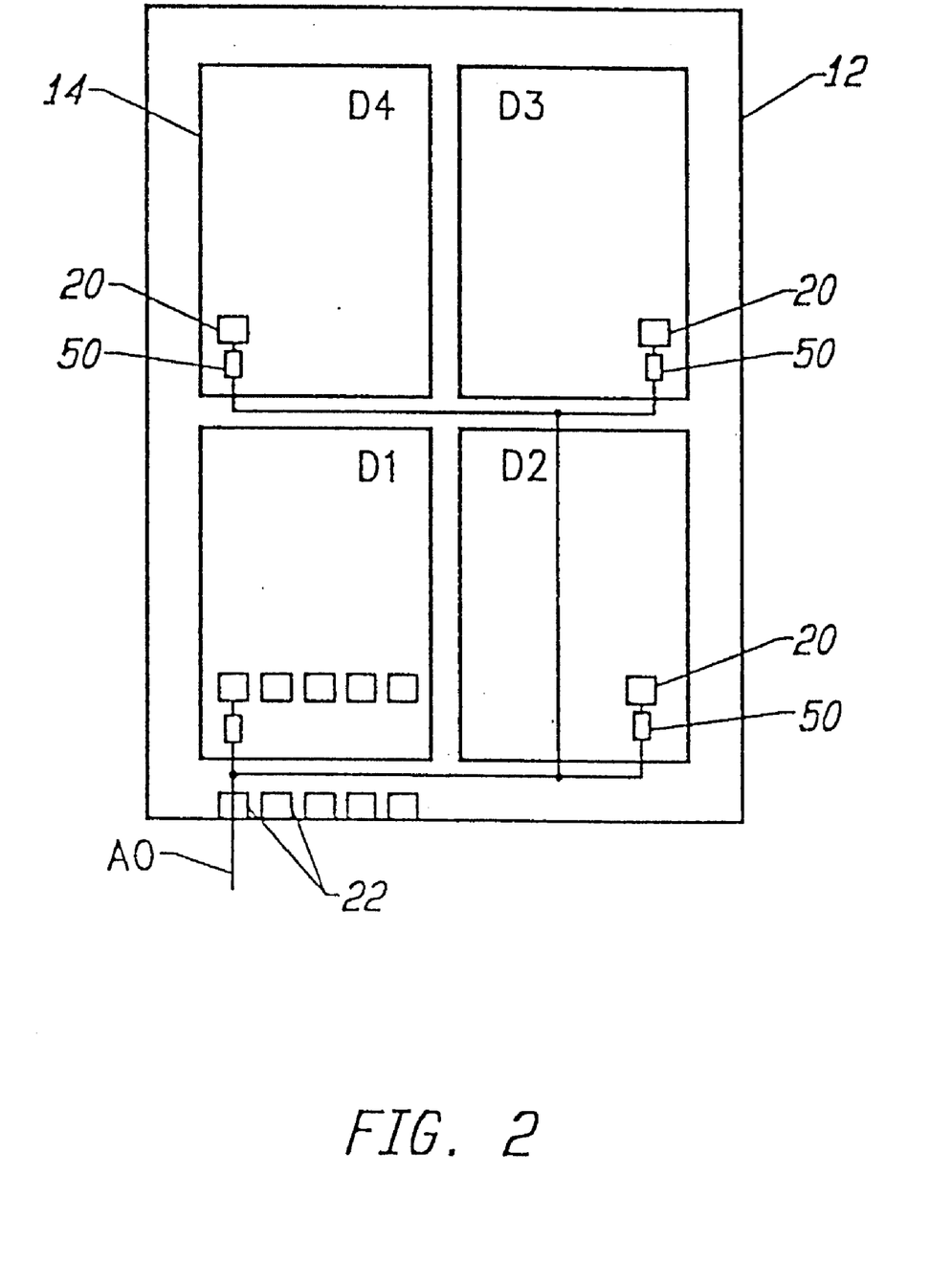
FIG. 2 is a diagram illustrating an address signal extending to four die on a segment through conductive fuses.

FIG. 2 is a diagram showing conductive fuses 50 of the present invention located on a segment 12 that enable the segment 12 and the die 14 thereon to be programmed. Every electrical signal transmitted to the segment 12, including power and ground, must first enter the segment 12 through a segment bond pad 22. Address signal A0 is shown, for instance, entering the segment 12 through segment bond pad 22, and then connecting to the four die 14 (D1, D2, D3 and D4). Before connecting to the die bond pads 20, the A0 signal must first pass through a respective conductive fuse 50. The second layer of gold interconnects 40 (FIG. 1) not only carry signals from the segment bond pads 22 to the die bond pads 20, but also form the conductive fuses 50.

Before segments 12 are assembled into a stack 10 and connected to external electrical circuits, such as A0 for example, the segments 12 are first tested for functionality. According to the present invention, if one of the die 14 is found to be defective (e.g., die D3), the defective die D3 is not physically cut out and discarded as in prior art methods, but is rather electrically disconnected from the segment 12. In one preferred embodiment, defective die 14 are disconnected by electrically opening the respective conductive fuse 50 on the second layer of gold interconnects 40 (hereinafter gold interconnect 40) of the defective die 14.

Figure 3:
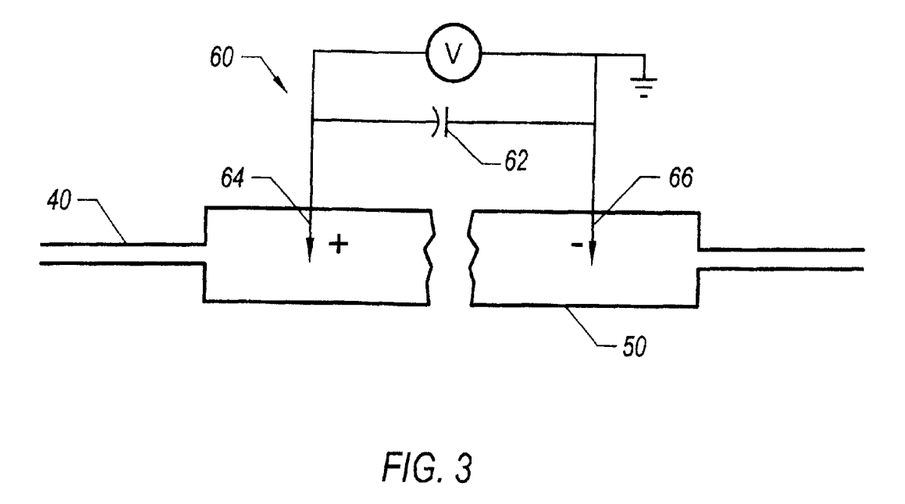
FIG. 3 is a diagram illustrating a conductive fuse of the present invention, and one preferred method of opening the conductive fuse using a circuit.

FIG. 3 is a diagram depicting one embodiment of the present invention for electrically opening a conductive fuse 50 using a circuit 60. As shown, the conductive fuse 50 is formed from a generally rectangular portion of gold interconnect 40, although other shapes are also suitable. The circuit 60 used to open the conductive fuse 50 includes a charged capacitor 62 which is located between two probes 64 and 66. Once the probes 64 and 66 contact the conductive fuse 50, the capacitor 62 applies a positive potential to probe 64 and ground potential to probe 66. The resulting current created between the probes 64 and 66 is larger than the capacity of the conducting fuse 50 and causes the conducting fuse 50 to physically open.

One disadvantage with the structure of the conductive fuse 50 shown in FIG. 3 is that during the process of opening the conductive fuse 50, the current created by the capacitor 62 often times escapes across the gold interconnect 40 and damages the die circuitry. Another disadvantage with the structure of the conductive fuse 50 is that not every attempt to open a conductive fuse 50 by the circuit 60 will succeed, because in some instances, the current generated by the circuit 60 is insufficient to open the conductive fuse 50. Thus, defective die may unintentionally remain electrically connected to a segment and result in a segment that may not function properly.

Figure 4A:
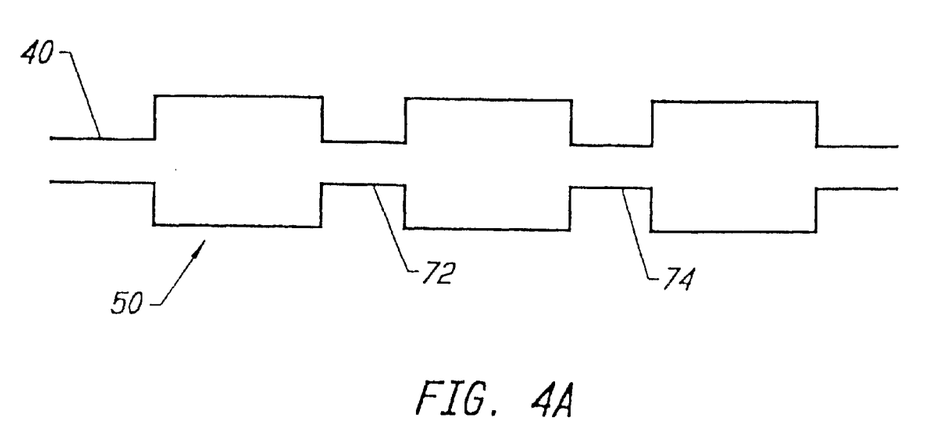
FIGS. 4A and 4B are diagrams illustrating a second preferred embodiment of the conductive fuse, and a method of opening the conductive fuse using a circuit of the present invention.

FIG. 4A is a diagram showing a second embodiment of the conductive fuse 50 of the present invention. The conductive fuse 50 includes a dual fuse structure wherein fuse 72 is connected in series with fuse 74. Because fuses 72 and 74 are smaller in area than the surrounding areas of the conductive fuse 50, the fuses 72 and 74 also have more electrical resistance and require less current to be opened.

Figure 4B:
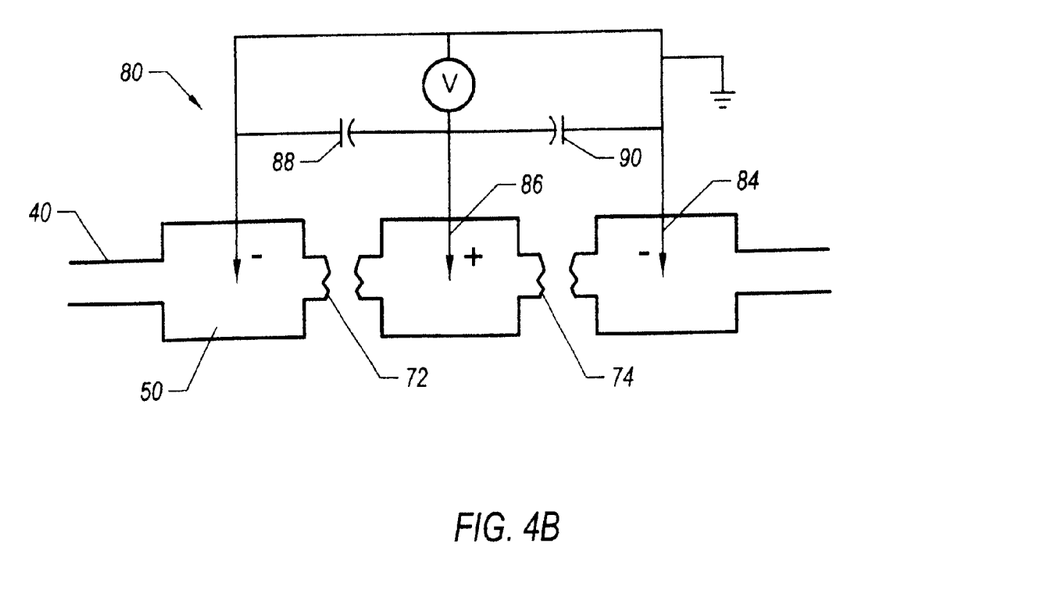

FIG. 4B is a diagram showing one method for opening the conductive fuse 50 of FIG. 4A, using a three probe circuit 80. The three probe circuit 80 includes two outer probes 82 and 84 and one center probe 86. A first capacitor 88 is located between the outer probe 82 and the center probe 86, and a second capacitor 90 is located between the center probe 86 and the outer probe 84. Once the three probes 82, 84, and 86 contact the conductive fuse 50, ground potential is applied to the two outer probes 82 and 84 while potential is applied to the center probe 86. The currents generated across the conductive fuses 72 and 74 (collectively fuse 50) cause both fuse 72 and fuse 74 to physically open.

The three probe circuit 80 and the dual fuse structure of the conductive fuse 50 provide several advantages. One advantage is that the three probe structure of the circuit 80 prevents the current from escaping across the gold interconnect 40 and damaging nearby circuits because the current created by the capacitors 88 and 90 is trapped between the two outer probes 82 and 84. Another advantage is that the dual fuse structure of the conductive fuse 50 increases the likelihood that the conductive fuse 50 will be opened by the current produced by the three probe circuit 80. Typically, the current generated by the three probe circuit 80 is sufficient to disconnect a defective die 14 by opening both fuse 72 and fuse 74. In some instances, however, the three probe circuit 80 may only open either fuse 72 or fuse 74. But even where only one of the two fuses 72 and 74 is opened, a defective die 14 is still disconnected from a segment 12 since the open fuse 72 or 74 prevents any current from reaching the defective die 14. Thus, the two fuse structure of the conductive fuse 50 increases the chances that the conductive fuse 50 will be opened to disconnect a die 14, thereby increasing the yield rate for segments 12 possessing the desired functionality.

Figure 5:
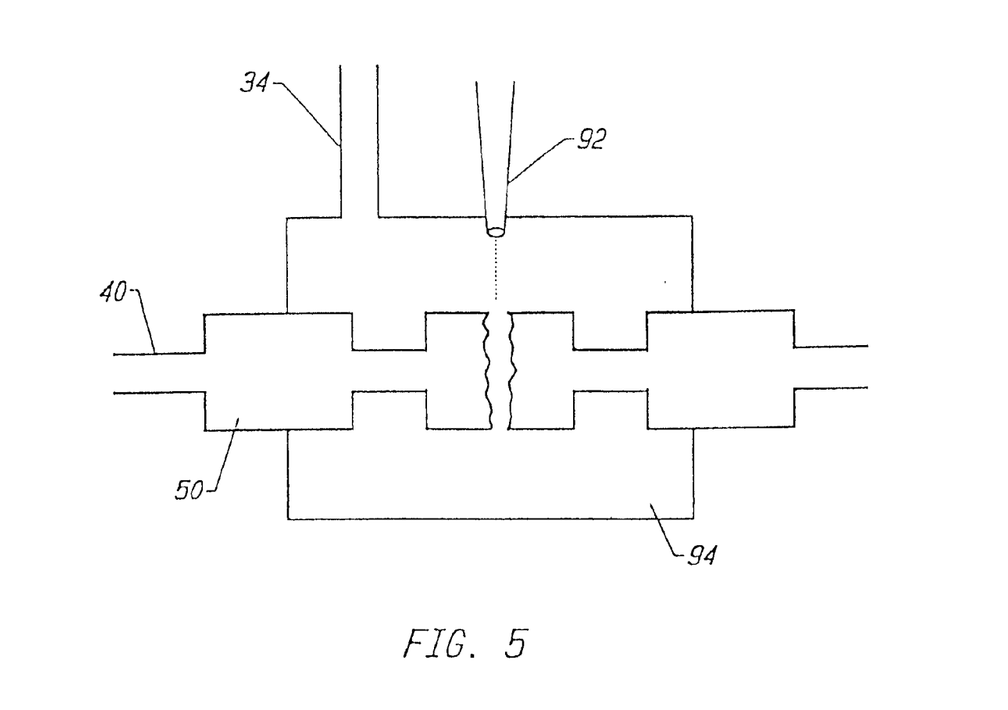
FIG. 5 is a diagram illustrating a third preferred embodiment of opening a conductive fuse using a laser.

FIG. 5 is a diagram of a third embodiment of opening a conductive fuse 50. In this embodiment, defective die 14 (FIG. 2) are disconnected using a laser 92 to vaporize and open the center portion of a conductive fuse 50. Since the energy from the laser 92 is sufficient to penetrate the gold interconnect 40, which forms the conductive fuse 50, the laser 92 is also capable of destroying the circuitry of the die 14 on a segment 12. To prevent the laser 92 from destroying the circuitry on the die 14, the first layer of gold interconnects 34 is patterned on the segment 12 underneath each conductive fuse 50 into a heat shield 94 to protect the die 14 from the laser 92. The width of the heat shield 94 is sufficiently larger than the width of the conductive fuse 50 so that the laser 92 may be activated at a point inside the heat shield 94, but outside the conductive fuse 50. The energy of the laser 92 is adjusted so it vaporizes the top layer of gold interconnects 40, but not the heat shield 94 underneath.

Referring again to FIG. 1, after the defective die 14 are disconnected, the segments 12 are programmed so that external decoding circuitry may access each segment 12 in the stack 10. For the purposes of this disclosure, programming refers to the process of routing control lines so that redundant functional die 14 replace the disconnected defective die 14. This is accomplished by connecting the control lines originally intended for the disconnected die 14 to the replacement die 14. Programming is necessary because once the segments 12 are stacked and become operative, a computer or the like may attempt to access a disconnected die 14 in the stack 10. Therefore, the segments 12 that have defective die 14 must be programmed so that when an attempt is made to access a defective die 14 in a stack 10, a functioning die 14 is accessed instead.

The term programming encompasses two separate programming procedures, segment level programming and circuit board level programming. Segment level programming, which occurs during the fabrication of a stack 10, refers to the process in which each segment 12 in a stack is made unique with respect to one another. Circuit board level programming, which occurs once a stack 10 is connected to external circuits, refers to the process of logically replacing defective die 14 in the stack 10 with functioning die 14 in the stack 10, described further below.

Figure 6:
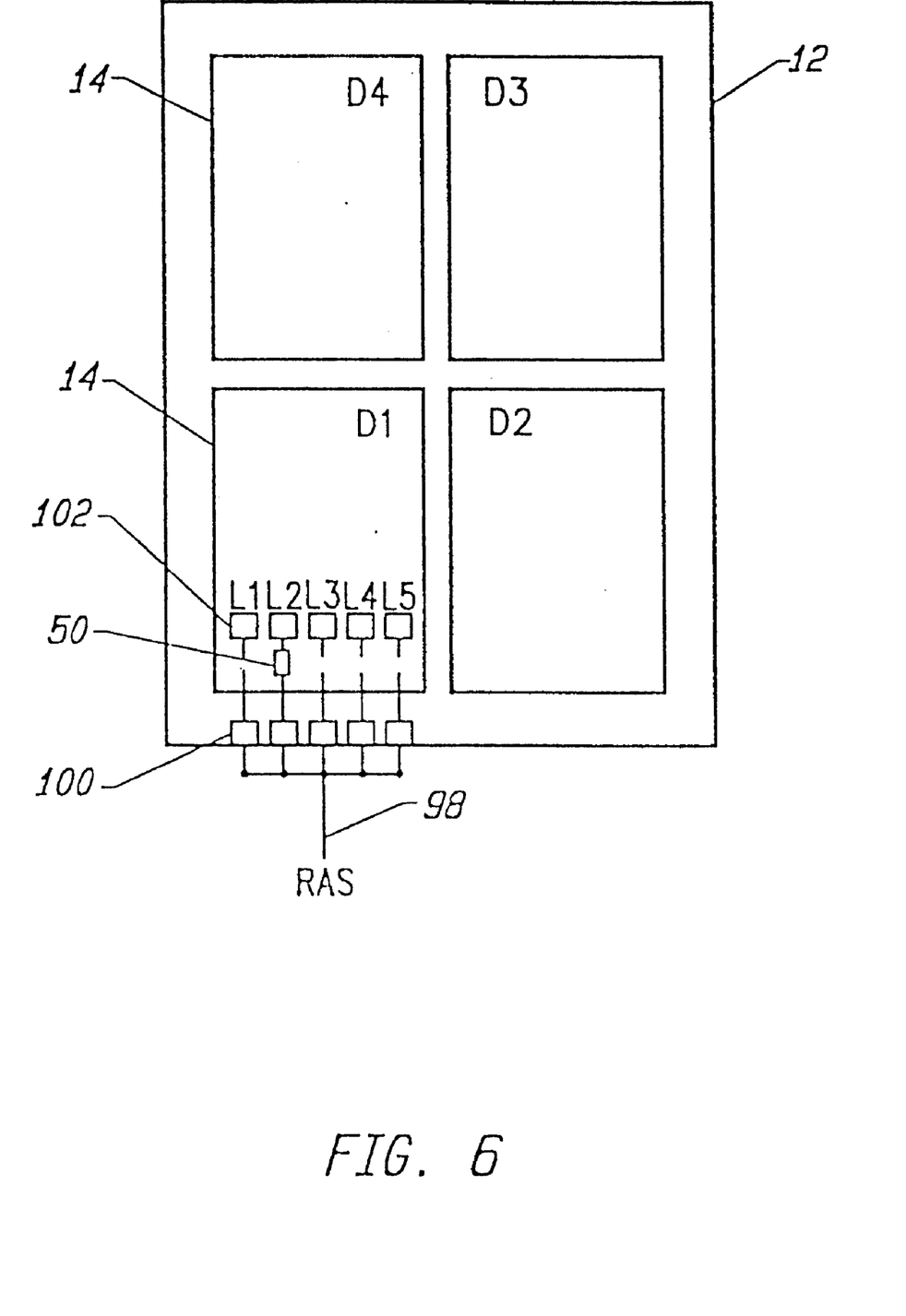
FIG. 6 is a diagram illustrating a method of segment level programming according to the present invention.

Referring now to FIG. 6, a segment 12 having four die 14 (D1, D2, D3, and D4) is shown, on which segment level programming has been performed according to the present invention. Although only shown on die D1 for purposes of illustration, each die on the segment 12 is externally addressed through a conventional row address strobe (RAS) signal 98. The interface between the RAS signal 98 and a die 14 comprises a set of segment control-bond-pads 100 and corresponding die control-bond-pads 102 equal to the number of levels in the stack. Each individual set of control-bond-pads 100 and 102 is assigned to a different level in the stack. Assuming a stack of segments 12 contains five levels, for example, then a series of five segment control-bond-pads 100 and corresponding die control-bond-pads 102 are required on each die 14, shown in FIG. 6, as L1, L2, L3, L4, and L5.

During segment level programming, each segment 12 in a stack 10 is made unique with respect to one another by leaving intact the conductive fuse 50 assigned to the level that the segment 12 occupies in the stack 10. The conductive fuses 50 assigned to other levels in the stack 10 are opened. If, for example, the segment 12 in FIG. 6 occupies level two in a stack 10, then all the fuses 50 would be opened (using the methods described above), except the conductive fuse 50 assigned to level L2, as shown. Similarly, the segment 12 occupying level three (not shown) in the stack 10 would have all the conductive fuses 50 opened except the conductive fuse 50 assigned to level L3, and so on for each level in the stack 10. When the RAS signal 98 is subsequently activated, only the segment 12 whose conductive fuses 50 are intact for that level will receive the RAS signal 98.

After segment level programming is performed on the segments 12, the segments 12 are stacked, and the stack 10 is electrically connected to external circuits, typically located on a circuit board for example. In a preferred embodiment of the present invention, the stack 10 is subsurface mounted to a circuit board, rather than mounted on the surface of the circuit board, and electrical contact is made between the stack 10 and the circuits on the circuit board through the use of electrically conductive epoxy.

Figure 7:
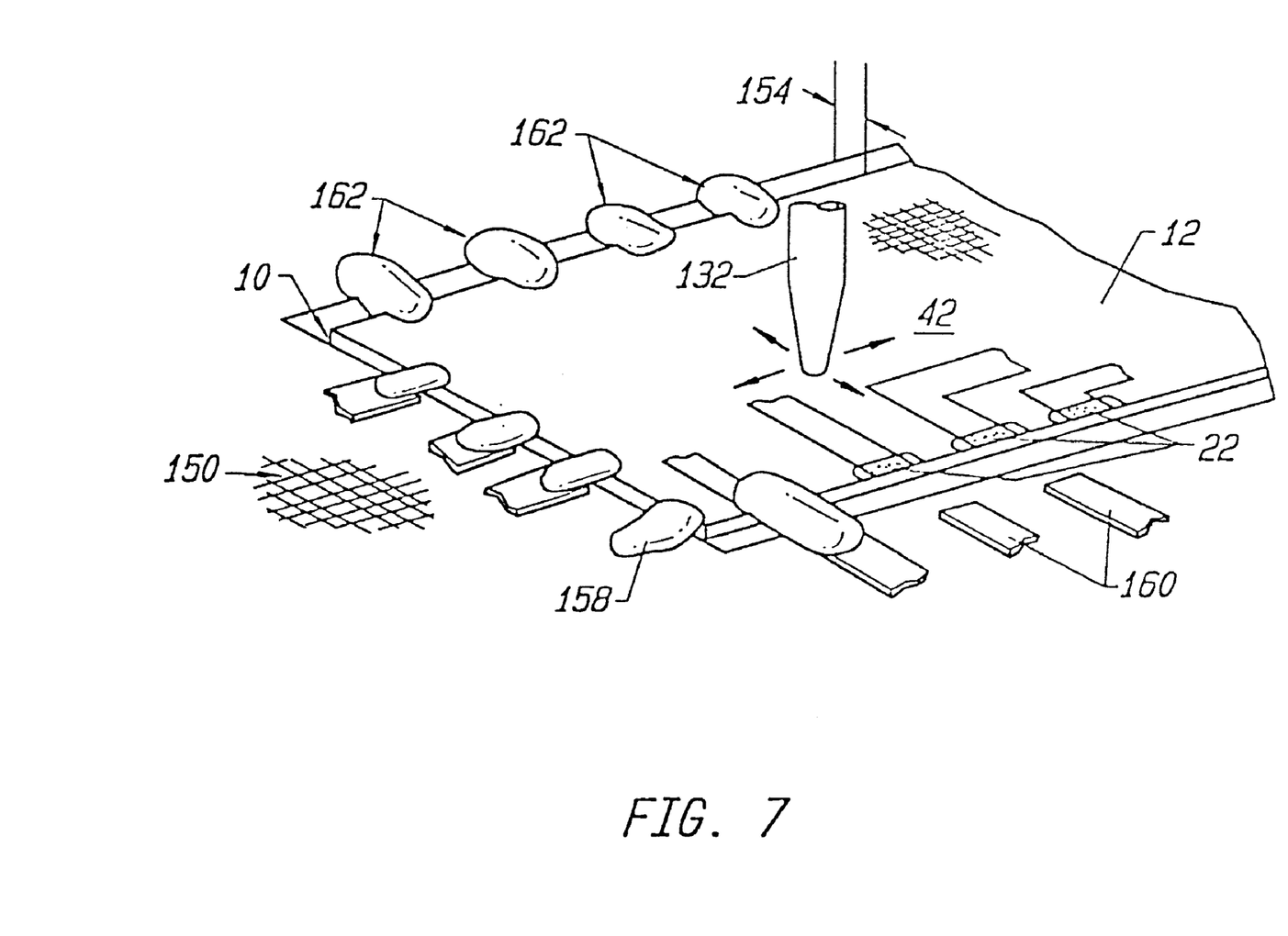
FIG. 7 is a diagram illustrating a stack that is subsurface mounted in a circuit board.

Referring to FIG. 7, a circuit board 150 is shown with a stack 10 subsurface mounted therein. The stack 10 is placed in a hole 154 cut into the circuit board 150 so that the top segment 12 of the stack 10 is coplaner with the surface of the printed circuit board 150, as shown. The stack 10 is held in place by small drops of fast-curing positional epoxy 158 applied at various locations around the perimeter of the stack 10.

The circuit board 150 includes a plurality of metal traces 160 which represent control signals. The stack 10 is positioned in the circuit board 150 so that the segment control-bond-pads 22 around the perimeter of the top segment 12 match the positions of the metal traces 160 on the circuit board 150. To bridge the gap between the segment control-bond-pads 22 and the metal traces 160 on the circuit board 150, a dispense mechanism 132 applies silver filled conductive epoxy between each segment control-bond-pad 22 and an opposing metal trace 160 on the circuit board 150 forming epoxy whiskers 162.

The epoxy whiskers 162 along with the epoxy traces 46 (FIG. 1), which are dispensed along the edges of the stack 10, interconnect the segments 12 in the stack 10 and provide an electrical connection between the circuit board 150 and the stack 10. Referring to FIGS. 1, 6 and 7, the RAS signal 98 originates from the circuit board 150 in the form of metal traces 160 and extends to each segment 12 in the stack 10 via the epoxy whiskers 162 and epoxy traces 64. Using the RAS signal 98 and conductive fuses 50, segment level programming of the present invention enables circuitry on the circuit board 150 to access any segment 12 in the stack 10.

Figure 8:
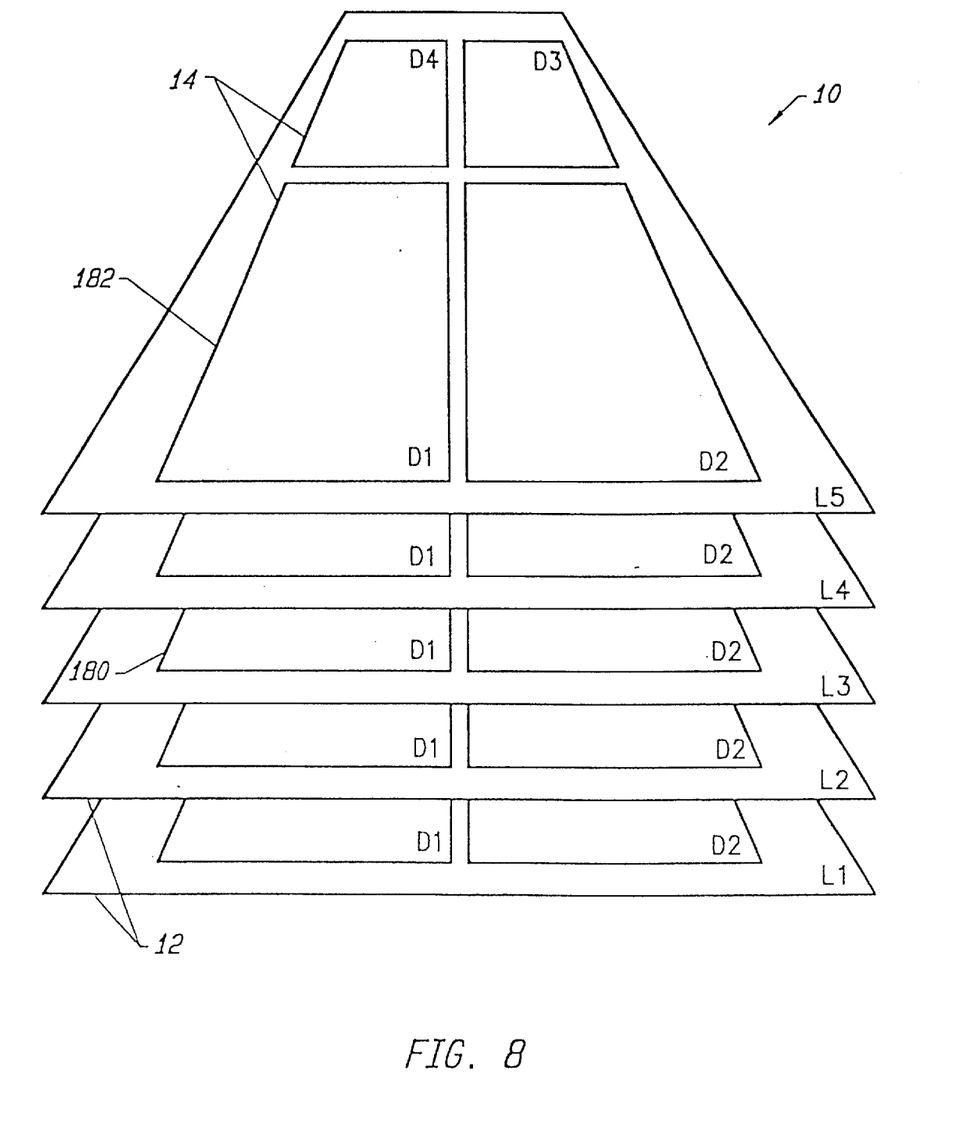
FIG. 8 is a perspective view illustrating a stack comprising five levels of segments.

FIG. 8 is a perspective view of a stack 10, which includes five levels of segments 12, labeled L1, L2, L3, L4, and L5, where each segment 12 includes four die 14 (D1, D2, D3, and D4). After the stack 10 has been fabricated and mounted onto a circuit board 150, it is not uncommon for semiconductor devices, such as die 14, to fail after a short period of operation. When a defective die 180 (D1) within a segment 12 of the stack 10 fails, the defective die 180 cannot be physically removed without damaging both the segment 12 and the stack 10. Die 14 failures are therefore remedied by logically replacing the defective die 180 with a functioning die 14 in the stack 10 through circuit board level programming.

For purposes of illustration, assume that every die 14 on levels L1 through L4 in the stack 10 shown in FIG. 8 are required to produce a functioning electronic device. As stated above, however, die 180 on level L3 is defective. Since the die 14 on L1 through L4 are unavailable to replace the defective die 180, level L5 is provided as a redundant level to supply replacement die 14. On a redundant level, only a replacement die 14 that is located in the same vertical column in the stack 10 as a defective die 180 is used to replace the defective die 180. Therefore, only the replacement die 182 on the redundant level L5 may be used to replace the defective die 180 on level L3 because both die 180 and 182 are in the same vertical column in the stack 10.

To logically replace the defective die 180 with the replacement die 182, the defective die 180 is first electrically disconnected from the segment 12, as described above. Next, the RAS signal 98 (FIG. 6) of the defective die 180 is routed to the replacement die 182 in accordance with the present invention.

Figure 9:
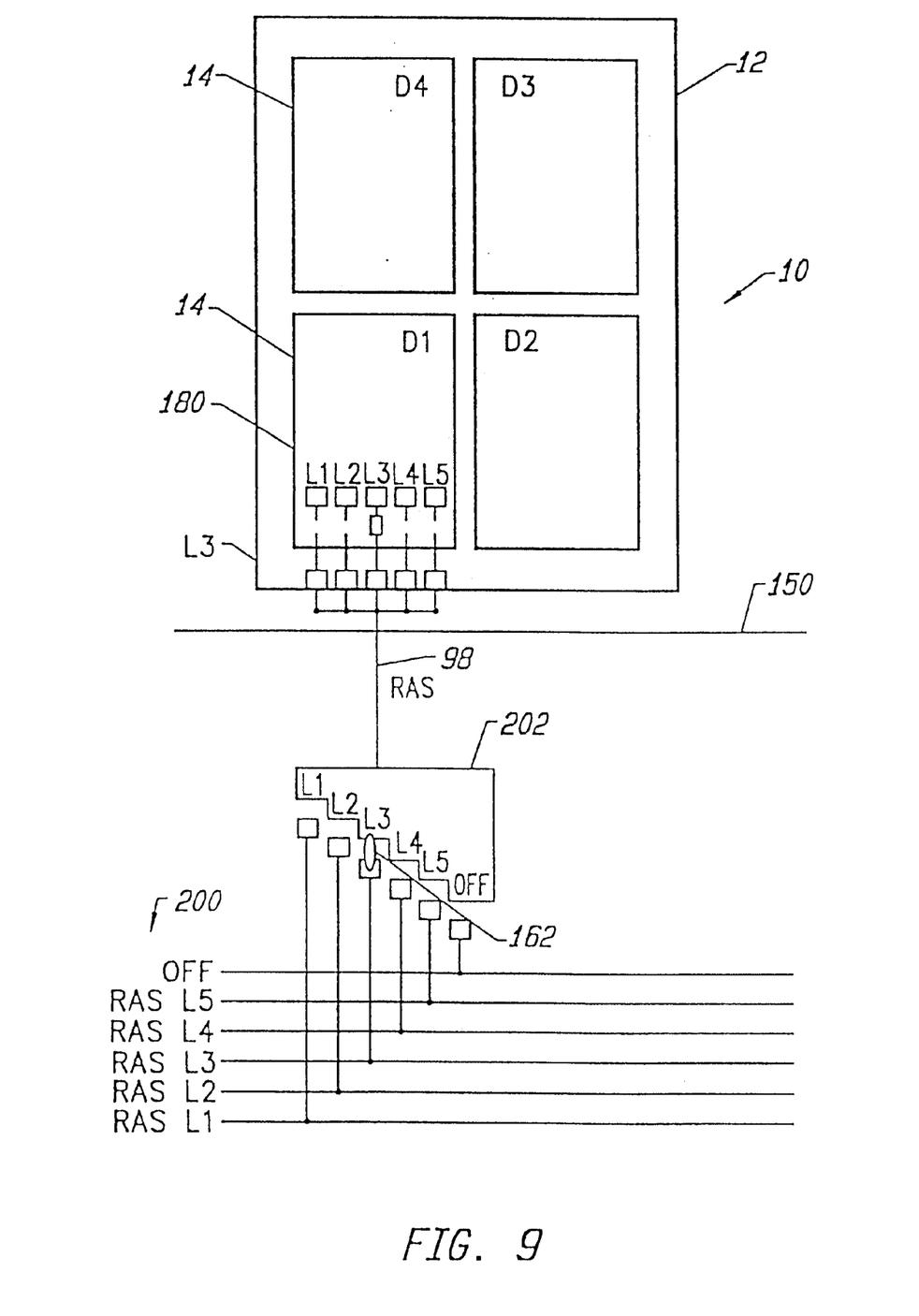
FIG. 9 is a top view of a stack and a circuit board showing how the die on each segment are addressed by external circuits.

FIG. 9 is a top view of a segment 12 in a stack 10 and a circuit board 150, showing how segments 12 are addressed from the circuit board 150 to allow the logical replacement of die 14 in the stack 10. The segment 12, which as an example is shown occupying level three (L3) in the stack 10, is addressed from the circuit board 150 through a set of RAS lines 200, and a set of metal switches 202. The set of RAS lines 200 includes a separate RAS line for each level in a stack 10, plus a line indicating no signal, called OFF. Thus, a stack 10 having five levels require six lines, one for each level in the stack and one for off, shown in FIG. 9 as RAS L1, RAS L2, RAS L3, RAS L4, RAS L5, and OFF.

As stated above, each die 14 in the stack 10 is addressed through a separate RAS signal 98. Connected between each RAS signal 98 and the RAS L1, RAS L2, RAS L3, RAS L4, RAS L5, and OFF lines, is a metal switch 202. Although only one RAS signal 98 and one metal switch 202 is shown for die D1 in FIG. 9, it is to be understood that every die 14 on each level in the stack 10 is connected to a RAS signal 98 and a corresponding metal switch 202.

The purpose of the metal switch 202 is to provide a flexible method for routing one of the RAS lines 200 to a RAS signal 98. In a preferred embodiment, the metal switch 202 is made of copper, although other conductive metals are also suitable. The metal switch 202 is capable of routing any of the RAS lines 200 to a corresponding RAS signal 98 through the use of an epoxy whisker 162 which is applied between the metal switch 202 and the selected RAS line 200.

During circuit board programming, every die 14 on a segment 12 in a stack 10 is connected to the RAS line 200 assigned to the level the segment 12 occupies. As shown in FIG. 9, since the segment 12 occupies level L3 in the stack, each die 14 on the segment 12 is connected to the RAS L3 line by dispensing an epoxy whisker 162 between each metal switch 202 and the RAS L3 line. When a die 14 is found to be defective, then the defective 14 is logic all replaced with a functioning die 14 by rerouting the RAS line 200 originally assigned to the defective die 14 to a redundant functioning die 14 using each of the die's respective metal switches 202.

Figure 10A:
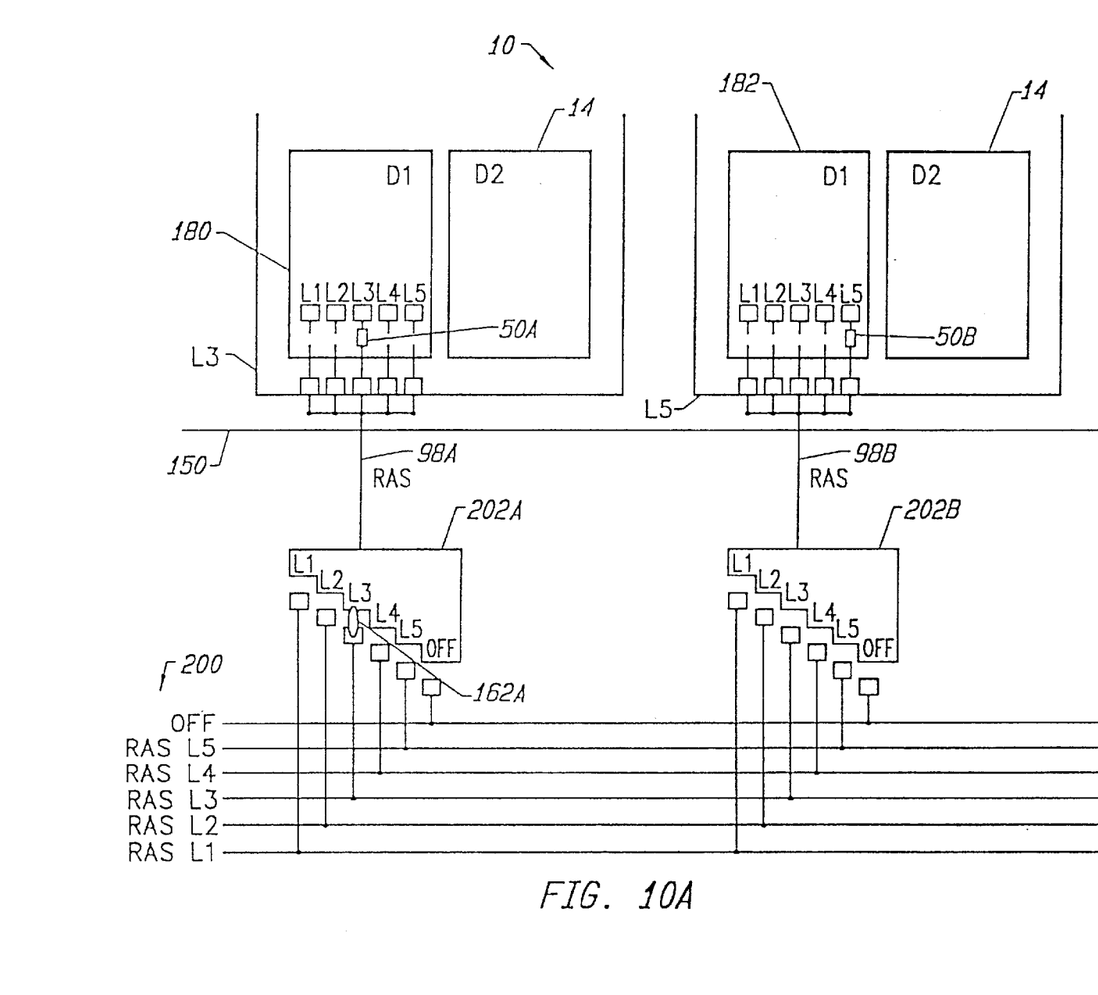
FIGS. 10A and 10B are top views of a stack aid a circuit board showing how a defective die in the stack is logically replaced with a functional die in the stack.
Figure 10B:
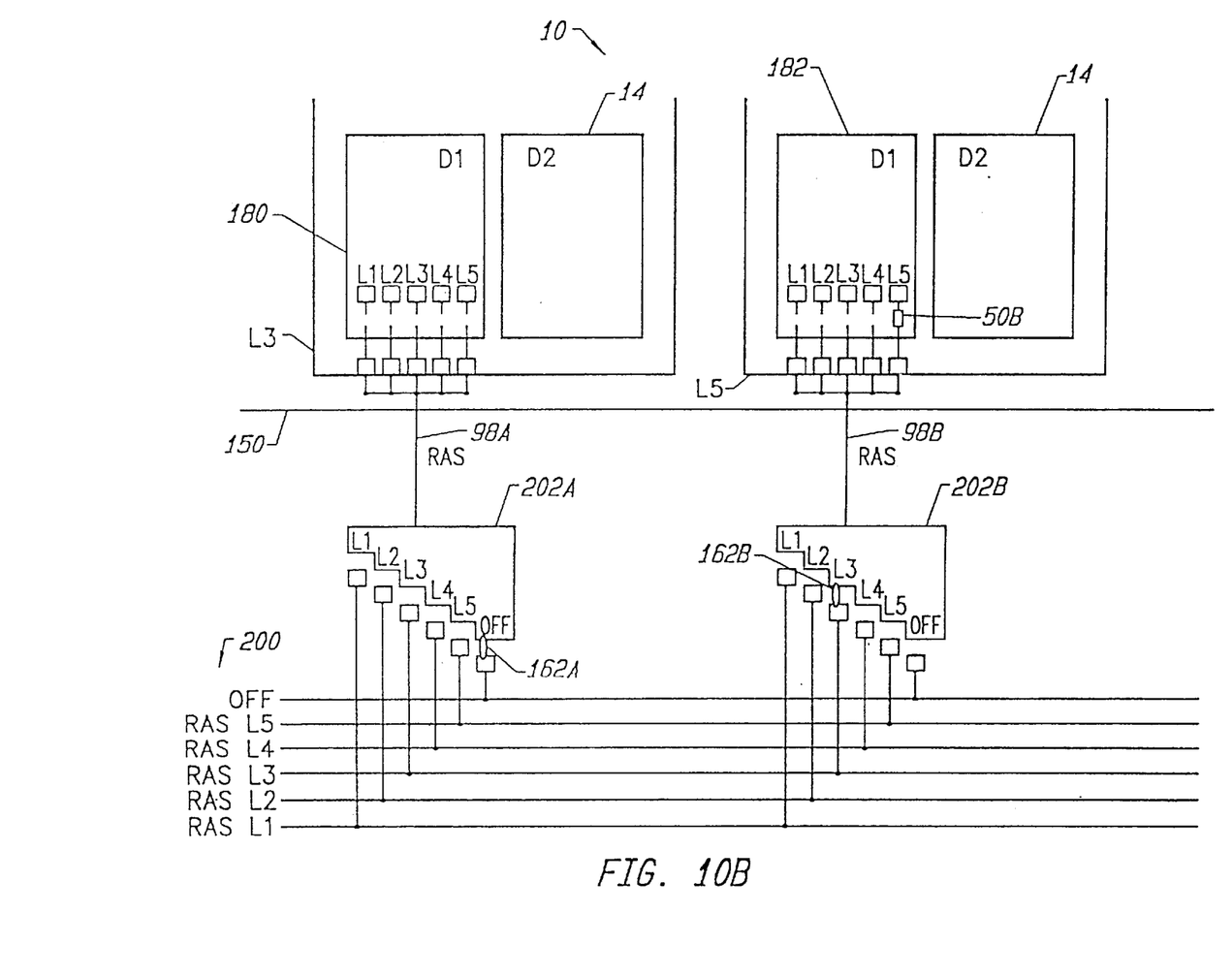

FIGS. 10A and 10B illustrate how the metal switches 202 are utilized during circuit board programming to logically replace a defective die 180 in a stack 10 with a functioning die 182. As in FIG. 8, the stack 10 shown contains five levels (L1 through L5) where level L5 is redundant. Level L3 in the stack 10 contains the defective die 180 which must be logically replaced with the replacement die 182 on level L5. FIG. 10A shows how the die 14 on both levels L3 and L5 are addressed in the stack 10 before it is discovered that die 180 is defective. FIG. 10B shows how the defective die 180 on level L3 and the replacement die 182 on level L5 are addressed after circuit board programming.

Referring to FIG. 10A, the segment 12 on level L3 is addressed as described with reference to FIG. 9. The die 180 is originally connected to the RAS L3 line by an epoxy whisker 162A that is connected between the RAS L3 line and the metal switch 202A. Also, the RAS signal 98A is connected between the metal switch 202A and the defective die 180 through the conductive fuse 50A.

As shown in FIG. 10A, level L5 is not originally connected to a RAS line 200, since level L5 in the stack 10 is redundant and is not required to be addressed from the circuit board 150. Also, the die 14 on level L5 are assigned to level L5 in the stack during segment level programming by connecting the RAS signal 98B to the conductive fuse 50B assigned to level L5, and opening the remaining fuses.

As shown in FIG. 10B, after it is discovered that die 180 is defective, circuit board programming is used to replace the defective die 180 in level L3 with the replacement die 182 in level L5. The first step in circuit board programming is to electrically disconnect the defective die 180 from level L3. In a preferred embodiment, the defective die 180 is first electrically disconnected from level L3 by moving the epoxy whisker 162A from the metal switch 202A and the RAS L3 line and placing the epoxy whisker 162A between the metal switch 202A and the OFF line. Alternatively, the defective die 180 may be electrically disconnected from level L3 by opening the fuse 50A (see FIG. 10A) assigned to level L3.

After the defective die 180 is disconnected from level L3, the RAS L3 line is re-routed to the replacement die 182 in level L5 by dispensing an epoxy whisker 162B between the metal switch 202B and the RAS L3 line. Since the RAS L3 line is now routed to the replacement die 182 through the metal switch 202B and the RAS 98B signal, when an attempt is subsequently made to access the defective die 180 through the RAS L3 line the replacement die 182 will be accessed instead. The remaining die 14 on level L5 may be used to replace other defective die found on any level within the stack 10, as described above.

In the examples above, it was assumed that a functioning electronic device required a stack of four functioning segments. In a preferred embodiment, where a device requires a stack of four segments, the stack is fabricated so that four redundant levels of segments may be added to the stack, providing a stack of eight segments. Creating a stack having equal numbers of redundant segments as required segments provides a functioning electronic device where only 50% of the die in the stack function properly.

In sum, a method and apparatus has been disclosed for segment level programming and circuit board level programming a stack of segments. Through the use of conductive fuses, metal connectors, and conductive epoxy, the programming methods of the present invention enable external circuits to uniquely address segments within a stack. In addition, the programming methods and apparatus of the present invention may also be used to uniquely address individual chips, rather than segments.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In a stack of silicon segments each having a plurality of die, an apparatus for routing a set of control-signal lines to a selected die located on a silicon segment, said apparatus comprising;

a plurality of bond pads on said selected die;

a plurality of electrically conductive fuses connected to said plurality of bond pads;

a signal line located externally of said segment electrically connected to said plurality of electrically conductive fuses;

switch means electrically connected between said signal line and said set of control-signal lines for routing a particular one of said control-signal lines to said selected die; and means for electrically disconnecting said selected die from said segment.

2. An apparatus as in claim 1 wherein said segment includes a plurality of segment bond-pads, and said signal line enters said segment through one of said plurality of segment bond-pads.

3. An apparatus as in claim 2 wherein said segment includes a plurality of die interconnected through metal interconnects, said plurality of electrically conductive fuses being formed from said metal interconnects.

4. An apparatus as in claim 3 wherein said switch means comprises a metal switch and electrically conductive epoxy removably placed between said metal switch and a particular one of said control-signal lines.

5. An apparatus as in claim 4 wherein said means for electrically disconnecting said die includes an electrical circuit capable of opening said electrically conductive fuses located on said die.

6. An apparatus as in claim 5 wherein said means for electrically disconnecting said die includes a laser capable of opening said electrically conductive fuses located on said die.

7. An apparatus as in claim 6 wherein said set of control-signal lines includes an off-signal line, and said means for electrically disconnecting said die uses said switch means to connect said die to said off-signal line.

8. A circuit for opening a conductive fuse comprising:

a first outer probe;

an inner probe;

a second outer probe;

a first capacitor attached between said first outer probe and said inner probe;

a second capacitor attached between said inner probe and said second outer probe; and indentations located along the longitudinal sides of said conductive fuse, wherein said circuit creates currents across said conductive fuse between said first outer probe and said inner probe and between said second outer probe sufficient to open said conductive fuse along at least one of said indentations.

* * * * *